(12) United States Patent
Rauhala

(10) Patent No.: US 11,696,062 B2
(45) Date of Patent: Jul. 4, 2023

(54) MAGNETIC CONNECTOR AND SENSOR FOR DETECTING A PRESENCE OF A FUNCTION

(71) Applicant: Finnovate Group LLC, Solana Beach, CA (US)

(72) Inventor: Kari Kristian Rauhala, Solana Beach, CA (US)

(73) Assignee: Finnovate Group LLC, Solana Beach, CA (US)

( * ) Notice: Subject to any disclaimer, the term of this patent is extended or adjusted under 35 U.S.C. 154(b) by 36 days.

(21) Appl. No.: 17/530,184

(22) Filed: Nov. 18, 2021

(65) Prior Publication Data

US 2023/0156393 A1    May 18, 2023

(51) Int. Cl.
| | |
|---|---|
| H04R 1/10 | (2006.01) |
| H01R 13/62 | (2006.01) |
| G01R 33/07 | (2006.01) |
| H04B 3/00 | (2006.01) |

(52) U.S. Cl.
CPC ......... *H04R 1/1041* (2013.01); *G01R 33/072* (2013.01); *H01R 13/6205* (2013.01); *H04R 2420/05* (2013.01)

(58) Field of Classification Search
CPC . H04R 1/1041; G01R 33/072; H01R 13/6205
USPC ........................................................ 381/74, 81
See application file for complete search history.

(56) References Cited

U.S. PATENT DOCUMENTS 5,581,626 A * 12/1996 Palmer ................... H03G 5/00
381/103

* cited by examiner

*Primary Examiner* — Ammar T Hamid
(74) *Attorney, Agent, or Firm* — FisherBroyles LLP; James P. Cleary

(57) ABSTRACT

A system for detecting a presence of a feature or function of an output device used with an electronic device. The system includes a connector associated with the output device, the connector having a magnetic region comprising one or more magnetized members to provide a magnetic field. The system further includes a magnetic sensor associated with the electronic device, the magnetic sensor being positioned proximate a connection port of the electronic device, the connection port being configured to receive the connector to enable the magnetic sensor to detect a presence of the magnetic field and to determine the feature or function of the output device. The system further includes control logic associated with the magnetic sensor, the control logic controlling the electronic device based on the presence of the magnetic field and according to the determined feature or function of the output device.

10 Claims, 6 Drawing Sheets

MAGNETIC CONNECTOR AND SENSOR FOR DETECTING A PRESENCE OF A FUNCTION

BACKGROUND

The present invention relates to media players, such as streaming audio players, and more particularly a media player that uses headphones with a headphone jack configured to mate with a jack receptacle in the portable media plater, the jack receptacle having a magnetic field sensor for detecting a presence of a feature or function of the headphones.

Media players are ubiquitously used in almost every form of human activity, from sports to studying, and from entertainment to work. Media players include portable media players such as MP3 players (in which audio files are stored on a device as discrete MP3 files, and played individually or "streamed" sequentially as a collection of files), and mobile phones with one or more media playing applications, and other devices.

Media players require at least one output device, such as an audio output device or graphical or video display, in order to electronically convey media from the media player to a user. Where the media is audio, the output device is typically headphones or other type of small speaker. Headphones connect to a signal source, such as a portable media player, either directly using a physical cord with a headphone jack or using wireless audio streaming technology such as Bluetooth or WiF. Where a physical cord is used, the headphone jack is configured to be inserted into a corresponding audio output port provided in the portable media player.

In some activities, such as activities in an aquatic environment, various headphones can be used for receiving an playing audio signals. For instance, most waterproof headphones use electro-acoustical transducers or drivers for converting electrical signals to sound, and the transducers are provided in a waterproof housing or shell so as to not incur water intrusion. Alternatively, bone conduction headphones, by which sound is transmitted to the user's ears via vibration conducted to skull bones proximate the user's ears, can also be used in an aquatic environment.

However, amplification levels of sound transmitted to headphones, whether normal electro-acoustical driver-based or bone-conducting, can differ significantly. Additionally, headphones configured specifically for adults or children can also utilize different amplification levels, or at the very least such amplification should be more tightly controlled in the case of child users.

What is needed is a system for detecting a type of headphones being used, so as to detect a presence of a feature or function of the headphones, and control a media player accordingly.

SUMMARY

This document presents a system for detecting a presence of a feature or function of an output device used with an electronic device.

In some aspects, the system includes a connector associated with the output device, the connector having a magnetic region comprising one or more magnetized members to provide a magnetic field. The system further includes a magnetic sensor associated with the electronic device, the magnetic sensor being positioned proximate a connection port of the electronic device, the connection port being configured to receive the connector to enable the magnetic sensor to detect a presence of the magnetic field and to determine the feature or function of the output device. The system further includes control logic associated with the magnetic sensor, the control logic controlling the electronic device based on the presence of the magnetic field and according to the determined feature or function of the output device.

The details of one or more embodiments are set forth in the accompanying drawings and the description below. Other features and advantages will be apparent from the description and drawings, and from the claims.

BRIEF DESCRIPTION OF THE DRAWINGS

These and other aspects will now be described in detail with reference to the following drawings.

Like reference symbols in the various drawings indicate like elements.

DETAILED DESCRIPTION

Figure 1:
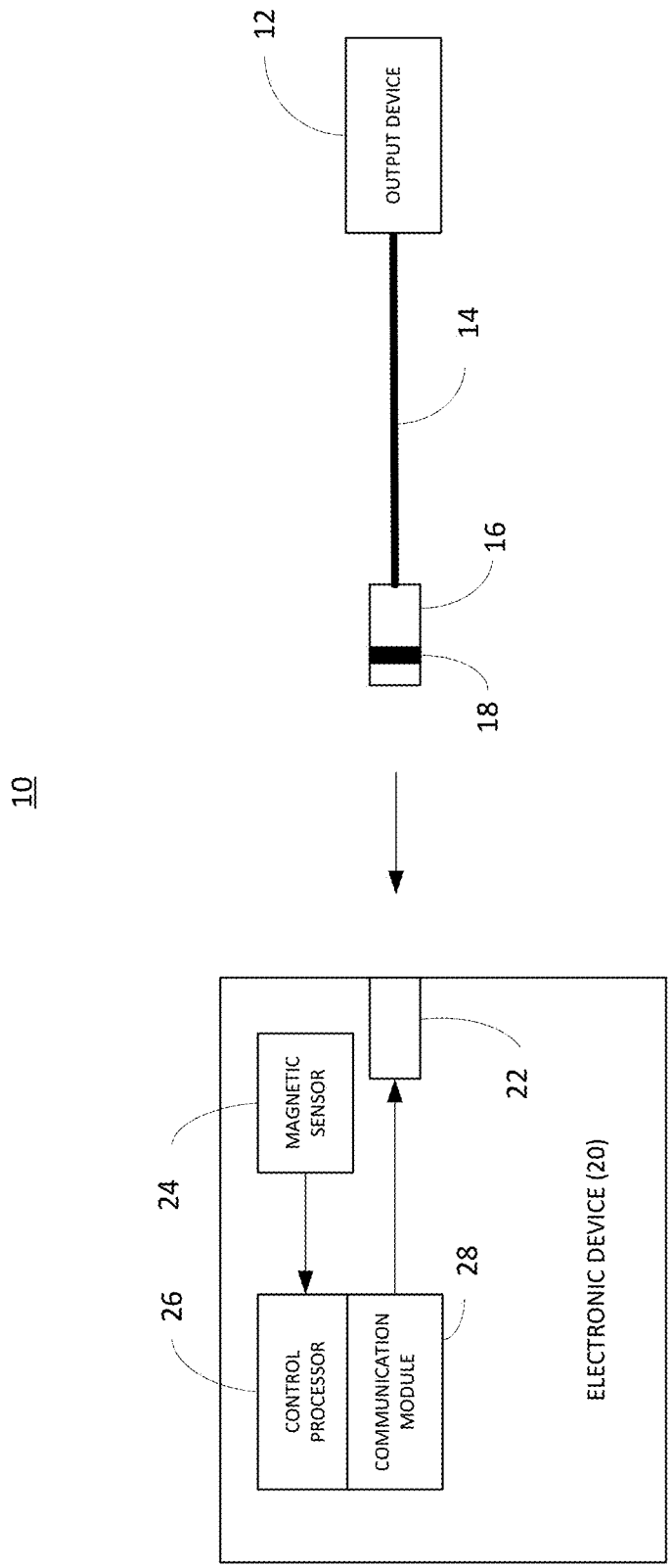
FIG. 1 illustrates a system in which an output device can be connected to or interfaced with an electronic device in order to detect and/or control a function or feature of the output device or the electronic device.

This document describes a system for detecting a function or a feature of an output device by an electronic device, such as digital media player, computing device, mobile phone, or other electronic device that can communicate digital data. FIG. 1 illustrates a system 10 in which an output device 12, such as headphones, speakers, a graphical display, a computing device or other electronic device with an audio and/or video output, or the like, can be connected to or interfaced with an electronic device 20 via connector 16, which physically connects to or interfaces with a communication port 22 on or in the electronic device 22. In some implementations, the connector 16 is connected with the output device 12 via wired connection 14, such as a cable, or can be connected via wireless channel such as a Bluetooth, Bluetooth Low Energy (BLE), WiFi, or other wireless communication channel or protocol. In the wireless implementation, the connector 16 can have a wireless transmitter or transceiver to communicate with the output device 12.

In either case, the connector 16 for the output device 12 includes one or more magnetic portions 18 that provides a magnetic field. The magnetic field can be provided at a particular magnitude or density, or at a particular location on the connector 16, to act as a "fingerprint" of the output device 12 that is being connected with the electronic device 20. This fingerprint, as represented by the magnetic field, can be used to identify the output device 12 and its functions and features, and/or used to control various functions of the electronic device 20 so as to optimize or accommodate communications with the output device 12. The magnetic portion 18 can include one or more magnets embedded within, or attached to or on the connector 16.

The magnetic portion 18 of the connector 16, when the connector 16 is connected with the port 22 of the electronic device 22, is detected by a magnetic sensor 24, such as a Hall sensor for sensing a Hall effect of the magnetic field provided by the magnetic portion 18. The magnetic sensor 24 can sense, detect, and determine the presence of the magnetic field, and a magnitude of the detected magnetic energy, so as to be able to signal a control processor 26 of the electronic device 20 to control an output of a communication module 28, which in turn communicates with the output device 12 via the port 22 and the connector 16.

The detection of the magnetic field from the connector 16 can also trigger the installation of certain software to match the connected output device 12 or other connectible device, such as speakers, for example. For example, when a computer detects that a unique USB device is connected to the computer, a software is auto-installed to be able to communicate with the device. Other functions of the system 10 can include "child proofing" audio level control to prevent too-high audio levels that could cause damage in a child's ear. In this case, a child-appropriate headphone can include a special magnetic audio jack, and the MP3 player will detect the magnet and not allow volume control beyond a certain level that has been determined to be safe for children. To distinguish different connectors or their associated products that are being connected to the electronic device 20, the special connectors can also have different, predetermined magnitudes of a magnetic field. The magnitude of the magnetic field of a connector can also be used to assign specific functions and identify the device that is connected. i.e. the magnitude of the magnetic field detected is like an identifier or "finger print" of the output device that is being connected.

Figure 2:
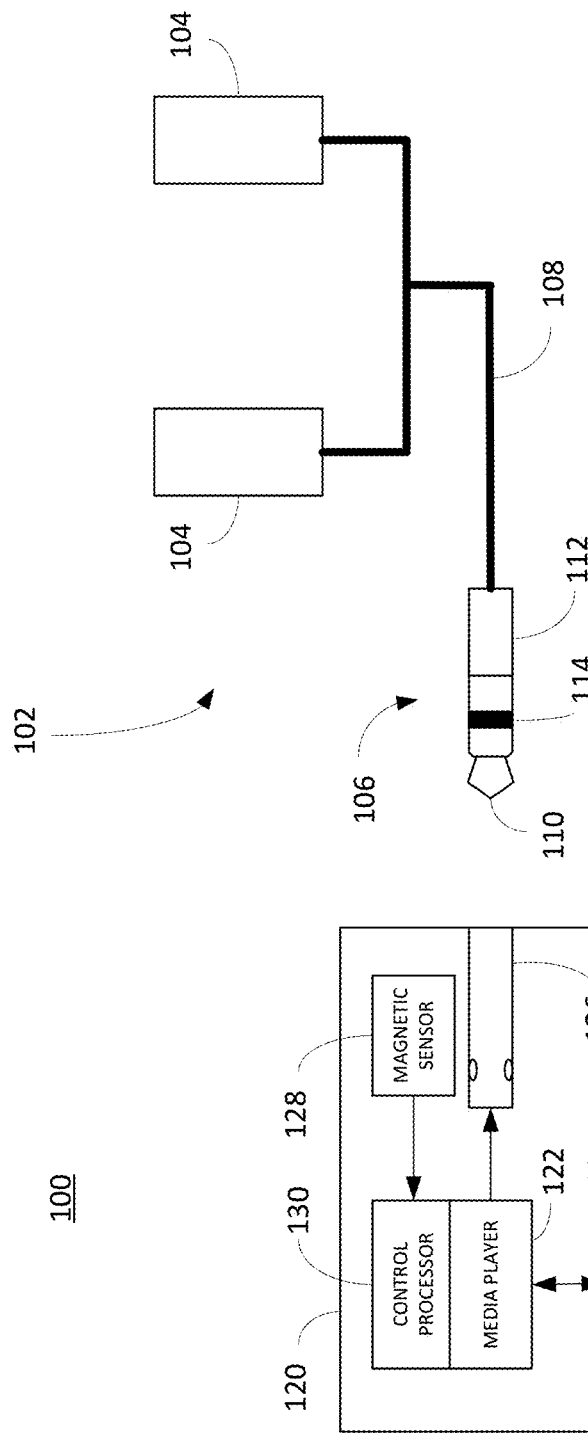
FIG. 2 illustrates an exemplary implementation of a system for detecting a function or a feature of an output device by an electronic device, and/or controlling a function or feature of the electronic device to accommodate the output device.

FIG. 2 illustrates an exemplary implementation of a system 100 for detecting a function or a feature of an output device by an electronic device, such as a computing device or digital media player device. In this example, the output device is a set of headphones 102 having one or two small loudspeakers 104 that are configured to be worn by a user over, in, or near the user's ears, and the electronic device is a media player device 120. In some instances, each loudspeaker 104 can be an "earbud" type of headphone speaker that is configured for being inserted into the outer ear canal. Alternatively, each loudspeaker 104 can be a "can" type of headphone speaker that is configured for being worn over the user's ear. Further still, each loudspeaker 104 can be a bone conduction speaker for transmitting sound vibrations to a user's ear via a cranial bone proximate the ear.

In some implementations, the headphones 102 can be wireless, i.e. not physically connected to the electronic device 120 but configured to receive digital or electronic signals from the electronic device 120 via a bi-directional wireless link such as Bluetooth, WiFi or other wireless communication channel and protocol. However, in some cases, such as in an aquatic environment, for example, the headphones 102 is connectable to a port 126 of the electronic device 120 via a headphone jack 106 that is in turn connected to the headphones 102, such as to the one or two loudspeakers 104, by an electric cable or cord 108, which can include a separate cable or cord from the headphone jack 106 for individually connecting each of the one or two loudspeakers 104. The headphone jack 106 and/or port 126 can include one or more waterproofing features, such as gaskets or a sealed housing or the like.

The headphone jack 106 includes a tip 110 and one or more sleeves 112 or rings. Each of the tip 110 and the one or more sleeves 112 can provide conduction of electric signals that represent audio signals, such as left and right channels for stereo audio. The one or more sleeves 112 can also include a ground connection, and/or a microphone connection. The tip can include an indentation or groove for mating with a corresponding spring or securement device in the audio port 126 of the electronic device 120 to secure the headphone jack 106 with the electronic device 120. The headphone jack 106 can be any of a variety of jacks, such as one of multiple standard 3.5 mm audio jacks, HDMI connector, USB connector, or the like.

Figure 3:
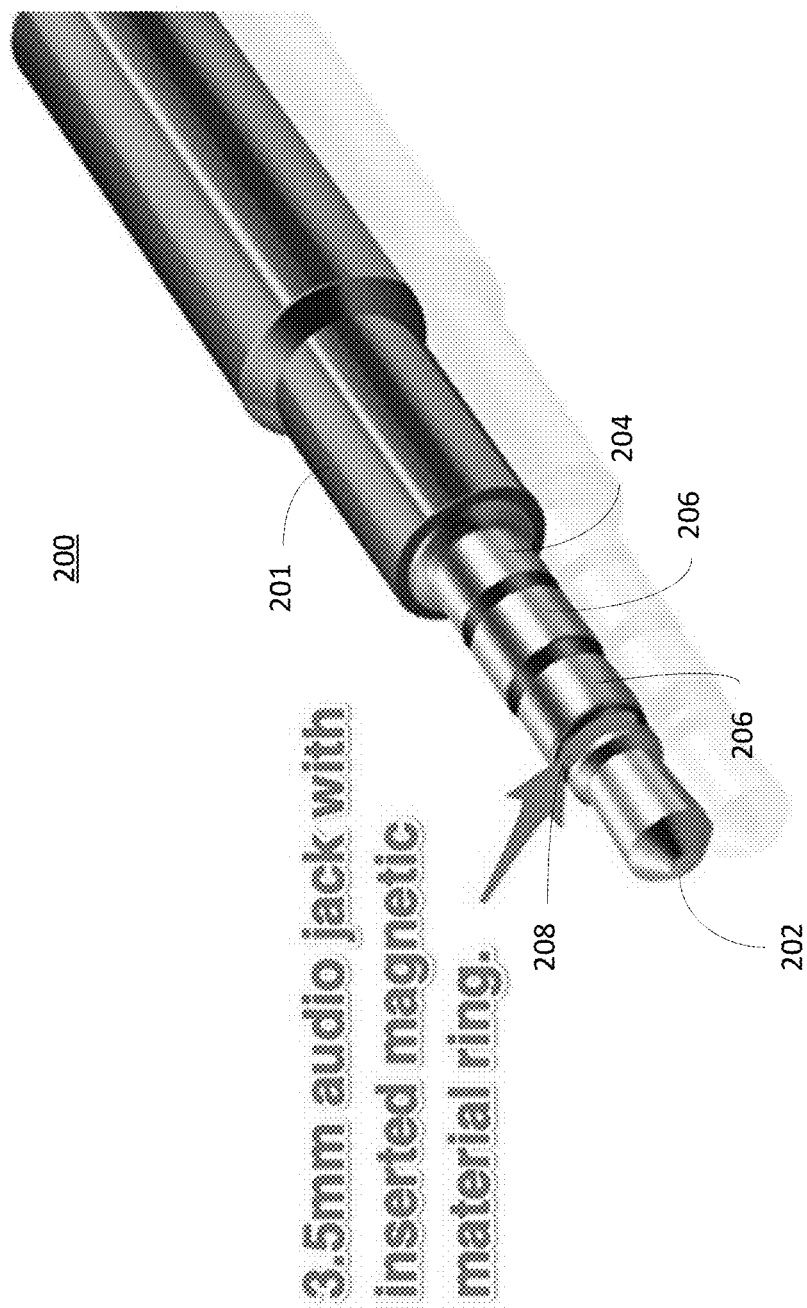
FIG. 3 illustrates a standard 3.5 mm audio jack with magnetic parts inside the audio jack assembly, in accordance with implementations described herein.

As shown in a specific example illustrated in FIG. 3, a headphone jack 200 can protrude from a support base 201, and include a tip 202, a sleeve 204, and one or more rings 206 positioned between the tip 202 and the sleeve 204. Each ring 206 is formed of a conductive material, such as metal, and is connected with a wire or other conductor (not shown) within the sleeve 204. Each ring 206 can conduct a signal, such as audio IN or audio OUT, or LEFT IN/LEFT OUT, for example. In some cases, one of the rings 206 can conduct signals from a microphone attached to the headphone jack 200. The headphone jack 200 includes a magnetic region 208, which can include a magnetic ring or one or more magnets embedded within the headphone jack 200, preferably between the tip 202 and the sleeve 204, although the magnetic region 208 can be positioned anywhere on the headphone jack 200, or other connector if used, such as an HDMI or USB connector.

Returning to FIG. 2, in implementations consistent with the present subject matter, the headphone jack 106 includes a magnetized region 114. The magnetized region 114 can include one or more magnets embedded therein, which can be configured to provide a specific magnetic field strength, charge, density or force. Magnetic forces are able to provide information about the charge carriers in a material, i.e. magnets, through what is known as the "Hall effect." This information from the magnetized region 114 can represent a special feature or function of the headphones 102, such as whether the headphones 102 is a set of headphones, and whether the headphones are electro-audio, bone conduction, or even volume-limited headphones for being used by children or hearing-impaired users.

In implementations further consistent with the present subject matter, the electronic device 120 further includes a media player 122, such as an application or other media-playing software, firmware and/or hardware, which plays digital media such as audio that is stored in a media storage 124. The media storage 124 can include a solid state memory, or be formed of cache memory for caching an audio stream that is downloaded from a remote location, such as from a server computer via the Internet or other network. The media player 122 is controlled by a control processor 130, which can be embedded in the media player, and provided as software, firmware and/or hardware. The control processor 130 controls the operation and functions of the media player, such as, for example, volume control, media selection and playing, and can receive instructions from an interface on the electronic device 120, such as an interactive graphical user interface or physical buttons or other controls.

The electronic device 120 further includes a magnetic sensor 128, such as a Hall sensor, that is configured to detect the presence and/or magnitude of the magnetic field from the magnetized region 114 of the headphone jack 106, via the Hall effect. The magnetic sensor 128 can then decode or determine the information from the magnetized region 114, i.e. the type of headphones 102 being used and connected to the electronic device 120, and send that information to the control processor 130 to control the media player 122 accordingly. Therefore, the media player 122 can provide audio and other media to the headphones 102 that is appropriate or configured specifically for the headphones 102 and its function(s) and/or features(s).

The presence or detection of a magnetic headphone jack 106 can turn on an internal audio amplifier in the media player device 120 to modify (i.e. amplify) the audio output signal level of the audio port 126, such as for identifying and accommodating a bone conduction speaker, which requires much more current to actuate the bone conduction speaker. If a normal (i.e. non-magnetic) headphone jack 106 is inserted into the media player device 120, the audio level is normalized for a regular dynamic speaker 104.

Figure 4:
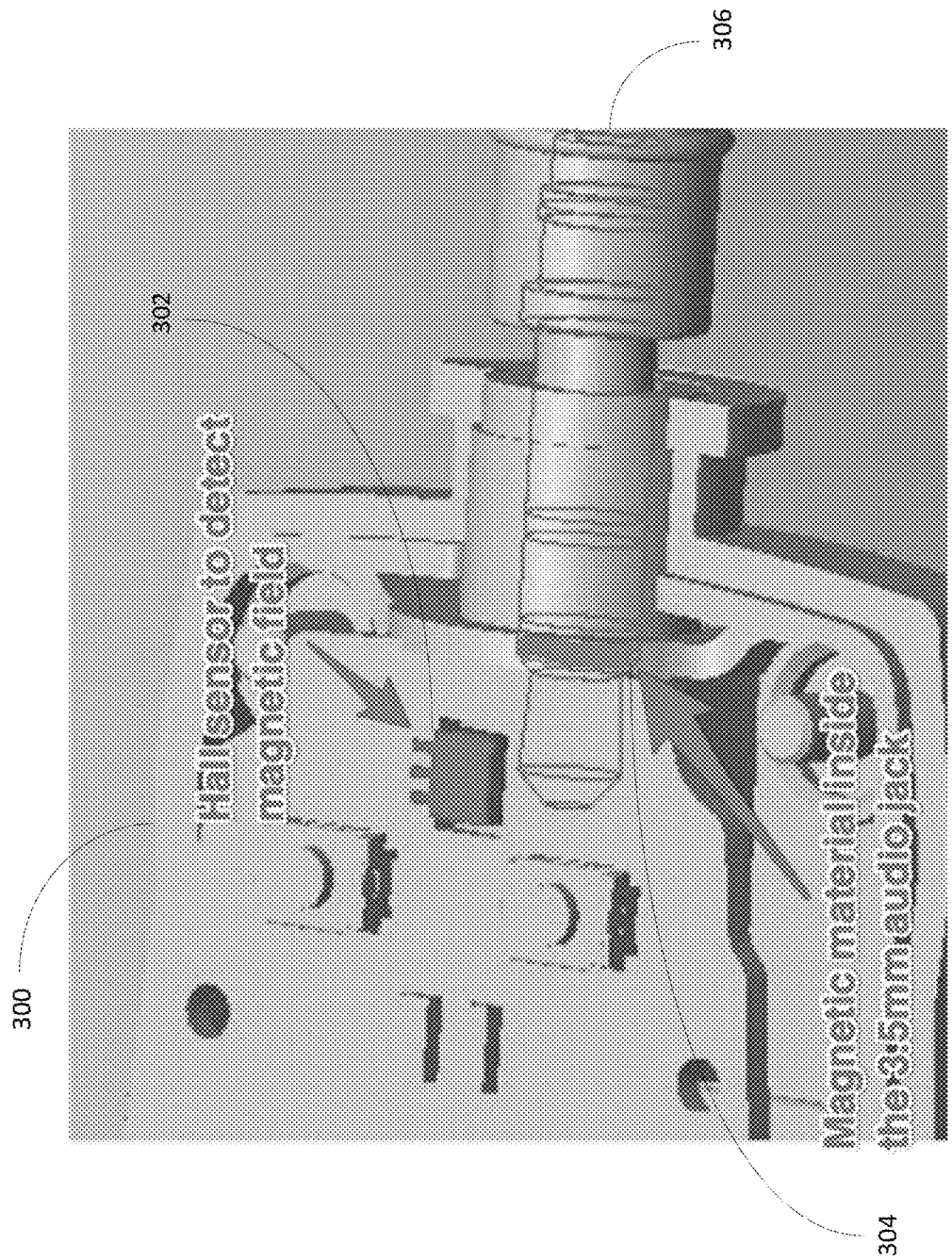
FIG. 4 depicts an electronic device having Hall sensor that is embedded therein, and positioned to detect a magnetic portion of an inserted connector.
Figure 5:
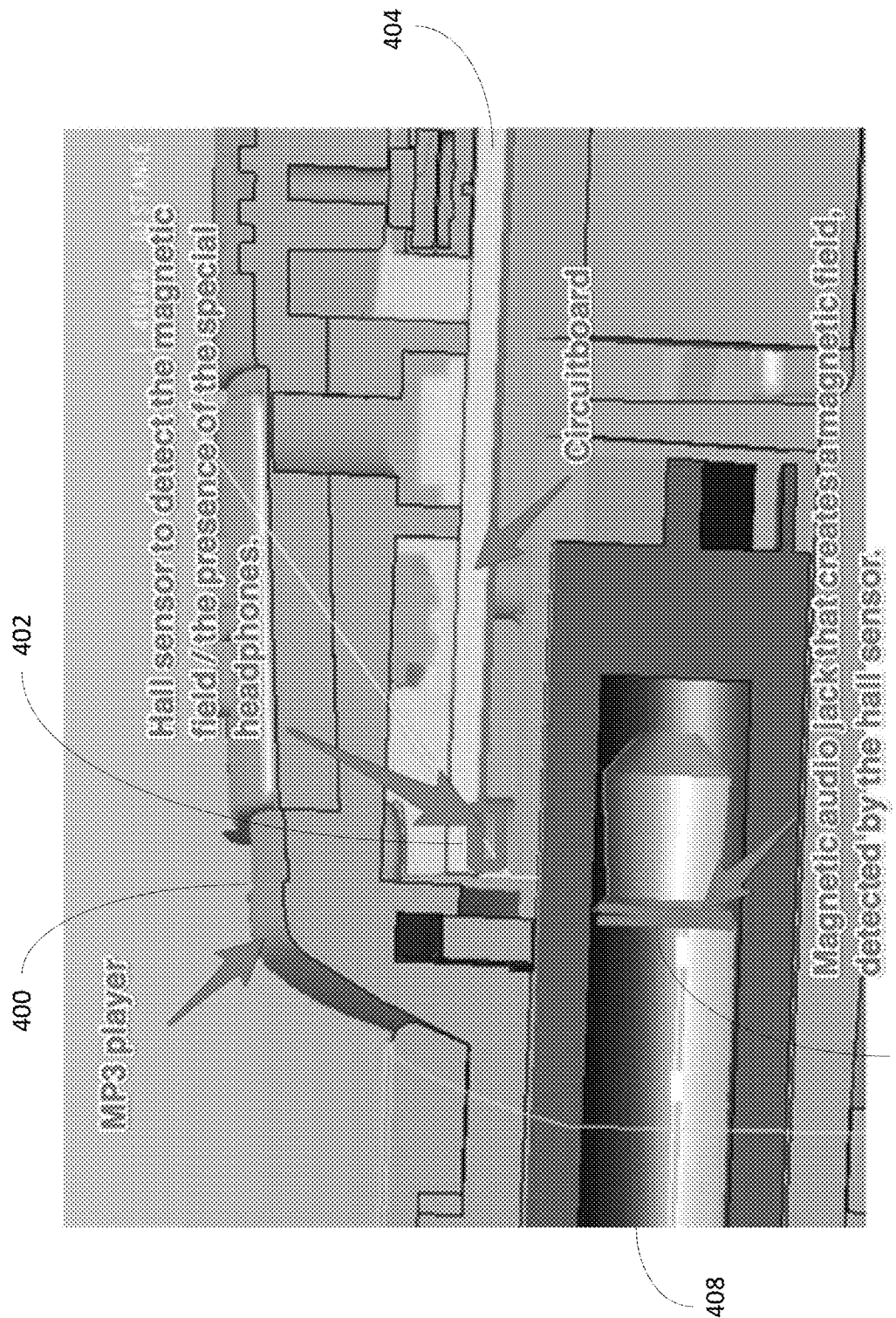
FIG. 5 depicts an MP3 player having Hall sensor that is embedded therein, and positioned to detect a magnetic field of an inserted 3.5 mm audio jack.

FIG. 4 depicts an electronic device 300 having Hall sensor 302 that is embedded therein, and positioned to detect a magnetic portion 304 of an inserted connector 306. The connector 306 can be a standard 3.5 mm audio connector, USB connector, HDMI connector, or any other connector. The magnetic portion 304 of the connector 306 can have a predetermined Hall effect or magnetic field pattern and/or magnitude, which can be detected by the Hall sensor 302, which in turn determines the magnitude and/or placement of the magnetic portion 304 on the connector to identify a device represented by the connector. The Hall sensor 302 can then generate control signals to control a function and/or features of the electronic device 300 to accommodate the functions and/or features of the device connected thereto via connector 306. FIG. 5 depicts an MP3 player 400 having Hall sensor 402 that is embedded therein, as part of a circuit board 404, and positioned to detect a magnetic field of a magnetic portion 406 of an inserted 3.5 mm audio jack 408.

Figure 6:
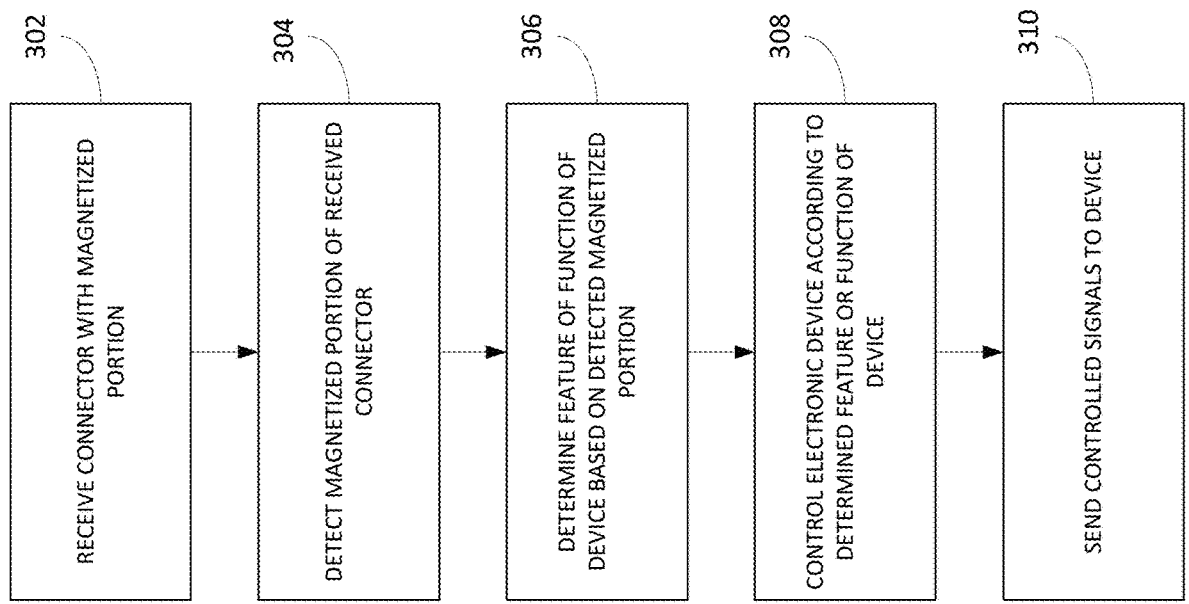
FIG. 6 is a flowchart of a method for detecting a function or a feature of an output device by an electronic device, and/or controlling a function or feature of the electronic device to accommodate the output device.

FIG. 6 is a flowchart of a method for detecting a function or a feature of an output device by an electronic device, and/or controlling a function or feature of the electronic device to accommodate the output device. At 302, the electronic device receives a connector. The connector can be a headphone jack, for example a standard 3.5 mm headphone jack. The electronic device receiving the connector includes a magnetic sensor, such as a Hall sensor, for detecting, sensing and quantifying a magnetic field and its magnitude, if present, of the received connector, at 304. At 306, the magnetic sensor, using software, circuitry or other logic associated therewith, measures or discerns a magnitude of the magnetic field of the connector to determine information from the magnetic field, such as an identity of a device associated with the connector, and therefore any feature or function of that device. The features or functions can be determined from a look-up table or other logic.

At 308, based on the determined feature(s) or function(s), the electronic device, such as a media player for example, can be controlled to provide an output, i.e. controlled signals at 310 to the device associated with the connector.

Although a few embodiments have been described in detail above, other modifications are possible. Other embodiments may be within the scope of the following claims.

The invention claimed is:

1. A system for detecting a presence of a feature or function of an output device used with an electronic device, the system comprising:
   a connector associated with the output device, the connector having a magnetic region comprising one or more magnetized members to provide a magnetic field;
   a magnetic sensor associated with the electronic device, the magnetic sensor being positioned proximate a connection port of the electronic device, the connection port being configured to receive the connector to enable the magnetic sensor to detect a presence of the magnetic field and to determine the feature or function of the output device; and
   control logic associated with the magnetic sensor, the control logic controlling the electronic device based on the presence of the magnetic field and according to the determined feature or function of the output device.

2. The system in accordance with claim 1, wherein the output device is a pair of headphones, and wherein the connector is a 3.5 mm audio jack.

3. The system in accordance with claim 1, wherein the one or more magnetized members include one or more magnets at least partially within the connector.

4. The system in accordance with claim 1, wherein the connector is at least partially cylindrical, and wherein the one or more magnetized members include at least one ring on an outer surface of the connector.

5. The system in accordance with claim 1, wherein the magnetic sensor is a Hall sensor.

6. A system for detecting a presence of a feature or function of an output device used with an electronic device, the system comprising:
   a connector associated with the output device, the connector having a magnetic region comprising one or more magnetized members to provide a magnetic field;
   a connection port of the electronic device, the connection port being configured to receive the connector;
   a magnetic sensor associated with the electronic device, the magnetic sensor being positioned proximate the connection port to enable the magnetic sensor to detect a presence of the magnetic field when the connection port receives the connector associated with the output device, and to determine the feature or function of the output device; and
   control logic associated with the magnetic sensor, the control logic controlling the electronic device based on the presence of the magnetic field and according to the determined feature or function of the output device.

7. The system in accordance with claim 6, wherein the output device is a pair of headphones, and wherein the connector is a 3.5 mm audio jack.

8. The system in accordance with claim 6, wherein the one or more magnetized members include one or more magnets at least partially within the connector.

9. The system in accordance with claim 6, wherein the connector is at least partially cylindrical, and wherein the one or more magnetized members include at least one ring on an outer surface of the connector.

10. The system in accordance with claim 6, wherein the magnetic sensor is a Hall sensor.

* * * * *